United States Patent
Hsu et al.

(10) Patent No.: US 9,799,601 B1
(45) Date of Patent: Oct. 24, 2017

(54) FUSE ELEMENTS AND METHODS FOR FORMING THE SAME

(71) Applicant: Vanguard International Semiconductor Corporation, Hsinchu (TW)

(72) Inventors: Ming-Sheng Hsu, Taibao (TW); Li-Che Chen, Hsinchu (TW); Hsing-Chao Liu, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/425,697

(22) Filed: Feb. 6, 2017

(51) Int. Cl.
| | |
|---|---|
| *H01L 23/52* | (2006.01) |
| *H01L 23/525* | (2006.01) |
| *H01L 23/528* | (2006.01) |
| *H01L 23/522* | (2006.01) |
| *H01L 23/532* | (2006.01) |

(52) U.S. Cl.
CPC ........ *H01L 23/5256* (2013.01); *H01L 23/528* (2013.01); *H01L 23/5226* (2013.01); *H01L 23/53295* (2013.01)

(58) Field of Classification Search
CPC ..... H01L 23/52; H01L 23/522; H01L 23/525; H01L 23/528; H01L 23/5226; H01L 23/5256; H01L 23/53; H01L 23/532; H01L 23/5329; H01L 23/53295
USPC .......................................................... 257/529
See application file for complete search history.

(56) References Cited

U.S. PATENT DOCUMENTS

| | | | | |
|---|---|---|---|---|
| 5,712,206 A | * | 1/1998 | Chen ..................... | H01L 23/291 148/DIG. 55 |
| 2005/0067671 A1 | * | 3/2005 | Park ..................... | H01L 23/5223 257/529 |

* cited by examiner

*Primary Examiner* — Monica D Harrison
(74) *Attorney, Agent, or Firm* — Birch, Stewart, Kolasch & Birch, LLP

(57) ABSTRACT

A fuse element includes a metal layer disposed on a substrate. The metal layer includes an intermediate segment, a first block and a second block. The first block and the second block are electrically connected to two respective ends of the intermediate segment. The fuse element also includes a dielectric layer covering the intermediate segment, the first block and the second block, a first passivation layer disposed on the dielectric layer, and a second passivation layer disposed on the first passivation layer. The fuse element further includes an opening penetrating through the first passivation layer, the second passivation layer and a portion of the dielectric layer, and located above the intermediate segment. In addition, a protective film is disposed on a bottom and a portion of a sidewall of the opening, and covers the first passivation layer exposed by the opening.

20 Claims, 6 Drawing Sheets

FUSE ELEMENTS AND METHODS FOR FORMING THE SAME

BACKGROUND OF THE INVENTION

Field of the Invention

The invention relates to fuse elements in semiconductor devices, and in particular to fuse elements having protective films and methods for forming the same.

Description of the Related Art

In the manufacturing of semiconductor devices, any single transistor defect or diode defect in an integrated circuit will always render the entire chip defective. Generally, densely packed integrated circuits will produce more device defects than loosely packed integrated circuits. Therefore, as the size of semiconductor devices decreases, and as the stacking level of integrated circuits becomes more and more dense, the yield of the chips may drop correspondingly.

To solve this problem, some redundancy circuits connected to the fuse elements may be added to the semiconductor devices. If the circuits of the semiconductor devices are found to be defective after the manufacturing process of the semiconductor devices, the redundancy circuits can be used to substitute for the defective circuits by utilizing the fuse elements.

Although existing fuse elements and methods for forming the same have been adequate for their intended purposes, they have not been entirely satisfactory in all respects. Therefore, up to the present, there are still some problems that can be overcome in the technology of fuse elements in semiconductor devices.

BRIEF SUMMARY OF THE INVENTION

The following disclosure provides embodiments of fuse elements and methods for forming the same. Regarding the fuse elements of the present disclosure, by disposing an opening penetrating through a first passivation layer, a second passivation layer and a portion of a dielectric layer above an intermediate segment of a metal layer (also called the fuse part of the fuse element), the position of a laser aimed at the intermediate segment can be precisely controlled, and the peripheral elements will not be damaged while the laser is subsequently used to blow the intermediate segment. On the other hand, a portion of the dielectric layer is exposed by the opening above the intermediate segment of the metal layer. In order to prevent the portion of the dielectric layer from interacting with external moisture, the present disclosure provides some embodiments for forming a protective film further in the opening, so that the fuse elements' ability to resist moisture can be increased, and the lifespan of the fuse elements can also be increased.

Some embodiments of the disclosure provide a fuse element. The fuse element includes a metal layer disposed on a substrate. The metal layer includes an intermediate segment, a first block and a second block, wherein the first block and the second block are electrically connected to two respective ends of the intermediate segment. The fuse element also includes a dielectric layer covering the intermediate segment, the first block and the second block. The fuse element further includes a first passivation layer disposed on the dielectric layer, and a second passivation layer disposed on the first passivation layer. In addition, the fuse element includes an opening penetrating through the first passivation layer, the second passivation layer and a portion of the dielectric layer, and located above the intermediate segment. In addition, the fuse element includes a protective film disposed on a bottom and a portion of a sidewall of the opening, and covering the first passivation layer exposed by the opening.

Some embodiments of the disclosure provide a method for forming a fuse element. The method includes forming a metal layer on a substrate. The metal layer includes an intermediate segment, a first block and a second block, wherein the first block and the second block are electrically connected to two respective ends of the intermediate segment. The method also includes forming a dielectric layer covering the intermediate segment, the first block and the second block. The method further includes forming a first passivation layer on the dielectric layer, and forming a second passivation layer on the first passivation layer. In addition, the method includes forming an opening above the intermediate segment. The opening penetrates through the first passivation layer, the second passivation layer and a portion of the dielectric layer. The method also includes forming a protective film on a bottom and a portion of a sidewall of the opening, and covering the first passivation layer exposed by the opening.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
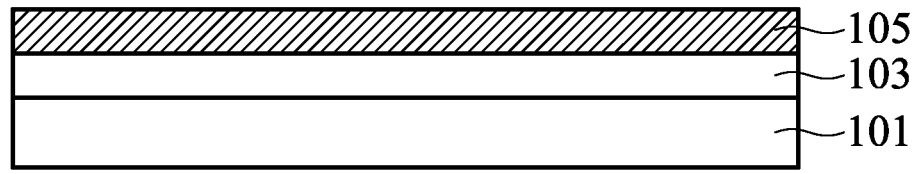
FIGS. 1A to 1I are cross-sectional views illustrating an exemplary sequential formation process of a fuse element in accordance with some embodiments.

The following disclosure provides many different embodiments, or examples, for implementing different features of fuse elements of the semiconductor devices provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Some embodiments are described below. Throughout the various figures and illustrative embodiments, like reference numbers are used to designate like features. It should be understood that additional operations can be provided before, during, and after the method, and some of the operations described can be replaced or eliminated for other embodiments of the method.

Embodiments for forming a fuse element are provided. FIGS. 1A to 1I are cross-sectional views illustrating an exemplary sequential formation process of a fuse element 100 shown in FIG. 1I in accordance with some embodiments.

As shown in FIG. 1A, a dielectric layer 103 is formed on a substrate 101, and a metal layer 105 is formed on the dielectric layer 103, in accordance with some embodiments. The substrate 101 may be made of silicon or another semiconductor material. Alternatively, the substrate 101 may include other elementary semiconductor materials such as germanium (Ge). In some embodiments, the substrate 101 may be made of a compound semiconductor such as silicon carbide (SiC), gallium nitride (GaN), gallium arsenic (GaAs), indium arsenide (InAs), or indium phosphide (InP). In some embodiments, the substrate 101 is made of an alloy semiconductor such as silicon germanium, silicon germanium carbide, gallium arsenic phosphide, or gallium indium phosphide. In some embodiments, the substrate 101 includes a silicon-on-insulator (SOI) substrate. In some embodiments, the substrate 101 includes an epitaxial layer. For example, the substrate 101 has an epitaxial layer overlying a bulk semiconductor. In some embodiment, the substrate 101 is a lightly doped p-type or n-type substrate.

In some embodiments, the dielectric layer 103 may be made of silicon oxide, silicon nitride, silicon oxynitride, or another applicable dielectric material. The metal layer 105 may be made of aluminum (Al), copper (Cu), nickel (Ni), tungsten (W), another applicable metal material or a combination thereof. In other embodiments, the metal layer 105 can be a conductive layer which is not limited to being made of a metal material. The conductive layer may be made of other conductive materials, for example, the conductive layer may be formed by depositing amorphous silicon, and then recrystallizing the amorphous silicon to form poly silicon.

In some embodiments, the dielectric layer 103 and the metal layer 105 are respectively formed by different processes such as chemical vapor deposition (CVD), low-pressure chemical vapor deposition (LPCVD), plasma enhanced chemical vapor deposition (PECVD), atomic layer deposition (ALD), physical vapor deposition (PVD), spin coating, another applicable process, or a combination thereof.

Figure 1B:
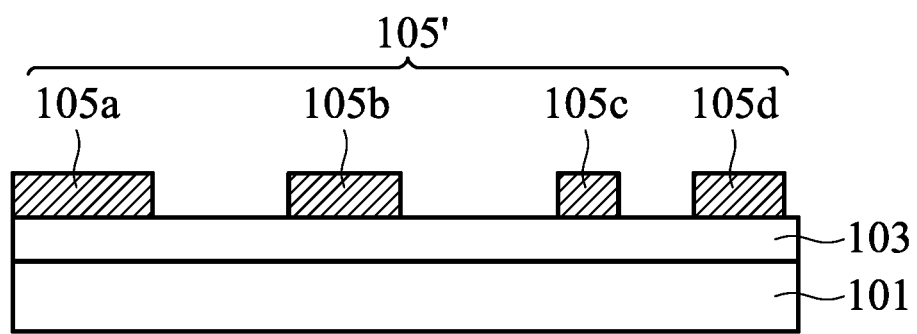

Next, as shown in FIG. 1B, the metal layer 105 is patterned to form a metal layer 105', the metal layer 105' includes a first block 105a, an intermediate segment 105b, and second blocks 105c and 105d. It should be noted that the intermediate segment 105b is disposed between the first block 105a and the second blocks 105c, 105d. Moreover, the first block 105a and the second blocks 105c, 105d are electrically connected to two respective ends of the intermediate segment 105d. Although the first block 105 shown in FIG. 1B is made up of a single block, and the second blocks 105c and 105d shown in FIG. 1B are made up of two blocks, in other embodiments, the first and second blocks may be made up of other quantities of blocks. In some embodiments, after disposing a photoresist layer (not shown) on the metal layer 105 in a spin coating process, the photoresist layer is exposed and developed to form the desired patterned photoresist layer (not shown). Then, the pattern of the patterned photoresist layer is transformed to the metal layer 105 located below the patterned photoresist layer by an etching process to form the metal layer 105'. In some embodiments, an anisotropic etching process, for example a reactive ion etch (RIE), may be utilized to remove the exposed and unprotected metal layer 105 while the patterned photoresist layer is used as a mask in the etching process. As a result, the metal layer 105' including the first block 105a, the intermediate segment 105b, and the second blocks 105c, 105d is formed on the substrate 101 and the dielectric layer 103.

Figure 1C:
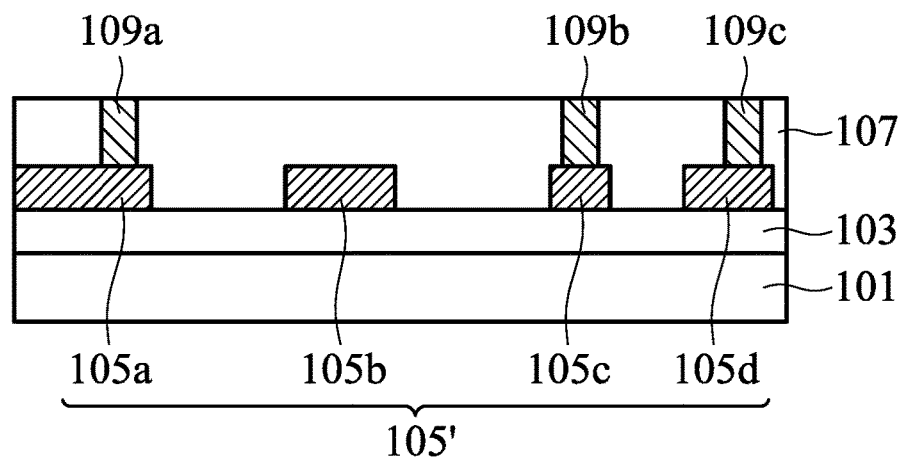

As shown in FIG. 1C, a dielectric layer 107 is formed on the dielectric layer 103, and the metal layer 105' including the first block 105a, the intermediate segment 105b, and the second blocks 105c, 105d on the dielectric layer 103 is covered by the dielectric layer 107, in accordance with some embodiments. Some materials and processes used to form the dielectric layer 107 are similar to, or the same as, those used to form the dielectric layer 103 and are not repeated herein.

Next, referring again to FIG. 1C, a first conductive via 109a and second conductive vias 109b and 109c are formed in the dielectric layer 107, in accordance with some embodiments. In some embodiments, the first conductive via 109a is disposed on the first block 105a, and electrically connected to the first block 105a. The second conductive via 109b is disposed on the second block 105c, and electrically connected to the second block 105c. The other second conductive via 109c is disposed on the other second block 105d, and electrically connected to the second block 105d.

The formation of the first conductive via 109a and the second conductive vias 109b and 109c includes forming several holes in the dielectric layer 107. These holes penetrate through the dielectric layer 107 and respectively expose the first block 105a and the second blocks 105c and 105d. Next, a conductive material is filled into these holes, and then a planarization process such as a chemical mechanical polishing (CMP) process is performed to remove the conductive material outside of the holes and on the dielectric layer 107.

In addition, the first conductive via 109a and the second conductive vias 109b, 109c may be made of aluminum (Al), copper (Cu), nickel (Ni), tungsten (W), another applicable metal material or a combination thereof. In some embodiments, the materials used to form the first conductive via 109a and the second conductive vias 109b, 109c may be different from those used to form the first block 105a, the intermediate segment 105b, and the second blocks 105c, 105d. For example, the first conductive via 109a and the second conductive vias 109b, 109c may be made of tungsten (W), and the first block 105a, the intermediate segment 105b, and the second blocks 105c, 105d may be made of aluminum copper (Al—Cu) alloy.

Figure 1D:
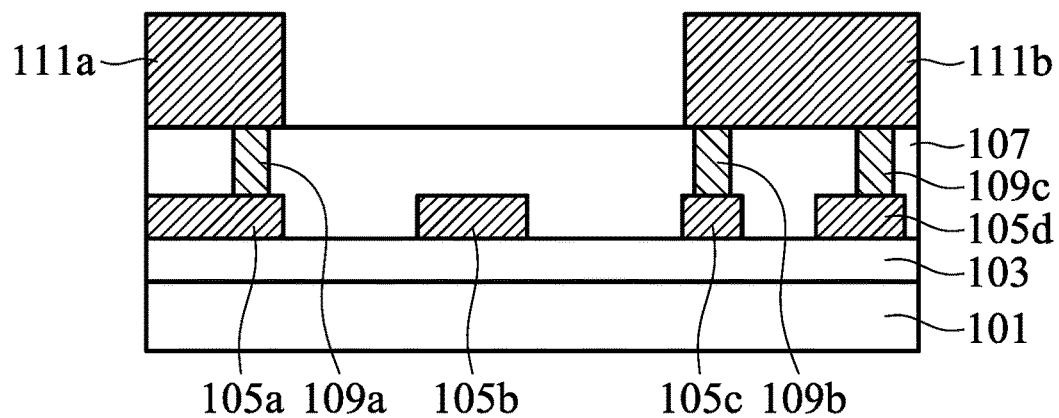

As shown in FIG. 1D, a first conductive pad 111a and a second conductive pad 111b are formed on the dielectric layer 107. The first conductive pad 111a and the second conductive pad 111b are respectively located above the first block 105a and the second blocks 105c, 105d, in accordance with some embodiments. In some embodiments, a conductive layer (not shown) and a mask layer (not shown) may be deposited on the dielectric layer 107. Then, a photolithography process and an etching process are performed to pattern the mask layer. Next, the pattern of the patterned mask layer is transformed to the conductive layer by an etching process to form the first conductive pad 111a and the second conductive pad 111b.

It should be noted that the first conductive via 109a is electrically connected to the first conductive pad 111a and the first block 105a. The second conductive vias 109b and 109c are electrically connected to the second conductive pad 111b and the second blocks 105c and 105d. On the other hand, the intermediate segment 105b is entirely covered by the dielectric layer 107. There is not a conductive via or conductive pad formed above the intermediate segment 105b.

Figure 1E:
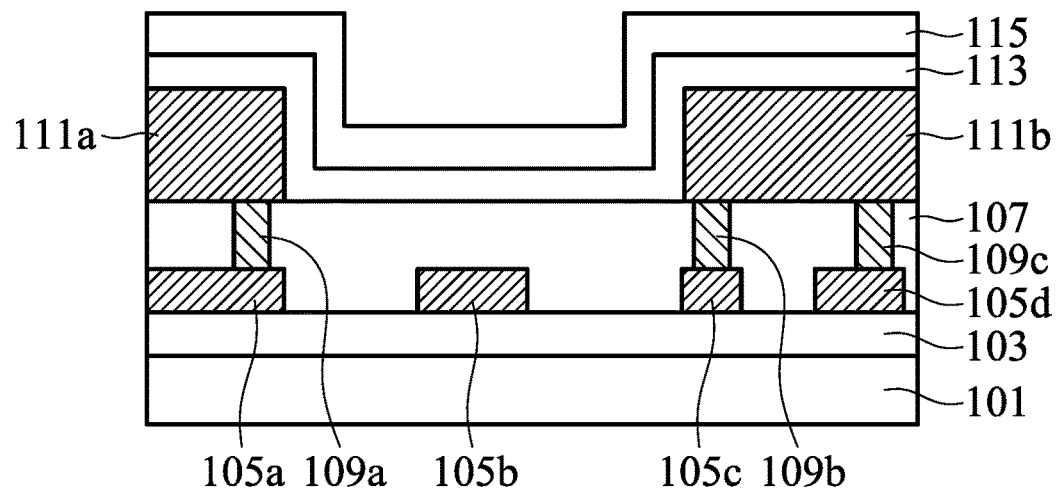

As shown in FIG. 1E, in accordance with some embodiments, a first passivation layer 113 is formed on a top surface and a sidewall of the first conductive pad 111a and on a top surface and a sidewall of the second conductive pad 111b. Moreover, the first passivation layer 113 extends onto the dielectric layer 107 between the first conductive pad 111a and the second conductive pad 111b. In some embodiments, the first passivation layer 113 may be made of silicon oxide, silicon nitride, silicon oxynitride, or another applicable material. In addition, the first passivation layer 113 is formed by chemical vapor deposition (CVD), low-pressure chemical vapor deposition (LPCVD), plasma enhanced chemical vapor deposition (PECVD), atomic layer deposition (ALD), physical vapor deposition (PVD), spin coating, another applicable process, or a combination thereof.

Next, referring again to FIG. 1E, a second passivation layer 115 is formed on the first passivation layer 113. Specifically, the second passivation layer 115 is conformally formed on the first passivation layer 113. In some embodiments, the materials and processes used to form the second passivation layer 115 are similar to, or the same as, those used to form the first passivation layer 113 and are not repeated herein. In the present embodiment, the first passivation layer 113 is made of silicon oxide, and the second passivation layer 115 is made of silicon nitride.

Figure 1F:
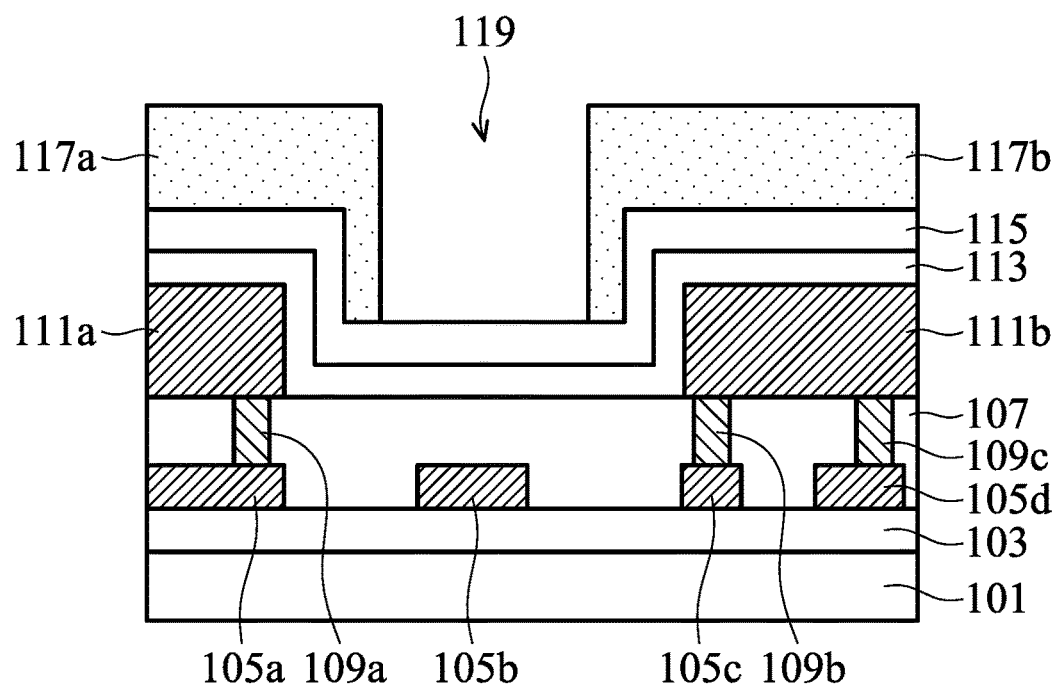

As shown in FIG. 1F, a patterned photoresist layer having two portions 117a and 117b are formed on the second passivation layer 115, in accordance with some embodiments. The step of forming the two portions 117a and 117b of the patterned photoresist layer includes forming a photoresist layer (not shown) on the second passivation layer 115, and then patterning the photoresist layer in a photolithography process. Photolithography processes include photoresist coating (e.g., spin-on coating), soft baking, mask aligning, exposure, post-exposure baking, developing the photoresist, rinsing and drying (e.g., hard baking).

More specifically, the portion 117a of the patterned photoresist layer is located above the first conductive pad 111a, and covering a portion of the second passivation layer 115 on the sidewall of the first conductive pad 111a. The portion 117b of the patterned photoresist layer is located above the second conductive pad 111b, and covering a portion of the second passivation layer 115 on the sidewall of the second conductive pad 111b. On the other hand, the portion 117a of the patterned photoresist layer covers and is in direct contact with the second passivation layer 115 on the top surface and the sidewall of the first conductive pad 111a. The portion 117b of the patterned photoresist layer covers and is in direct contact with the second passivation layer 115 on the top surface and the sidewall of the second conductive pad 111b.

In addition, the portions 117a and 117b of the patterned photoresist layer are not covering the second passivation layer 115 above the intermediate segment 105b, which means that there is a trench 119 between the portions 117a and 117b of the patterned photoresist layers. The trench 119 is located above the intermediate segment 105b. In other embodiments, the portions 117a and 117b of the patterned photoresist layer may not extend onto the second passivation layer 115 on the sidewalls of the first conductive pad 111a and the second conductive pad 111b, which means that the portions 117a and 117b of the patterned photoresist layer may merely be located on the top surface of the second passivation layer 115, and may not include a portion that extends downward.

Figure 1G:
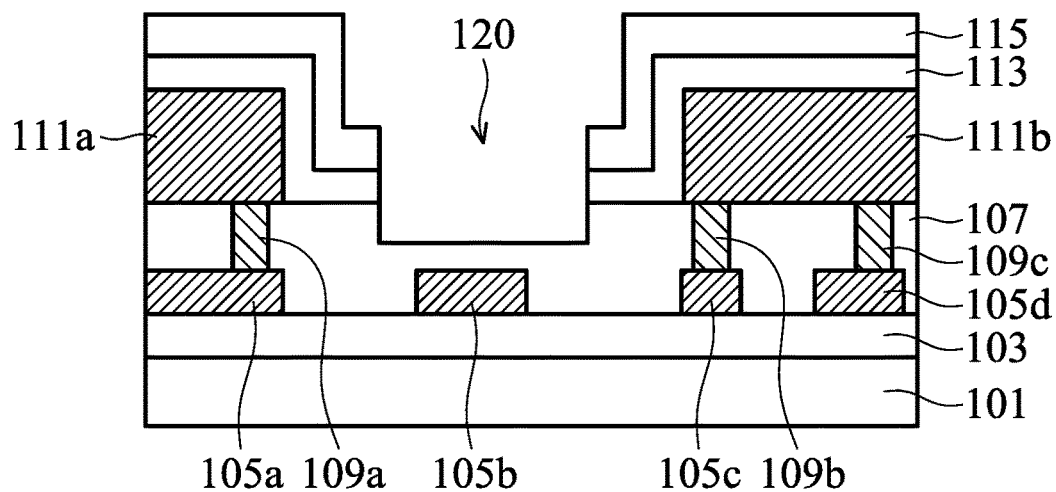

Next, as shown in FIG. 1G, by using the portions 117a and 117b of the patterned photoresist layer as a mask, an etching process is performed to remove the portions of the first passivation layer 113, the second passivation layer 115, and the dielectric layer 107 that are located above the intermediate segment 105b, so that an opening 120 is formed without exposing the intermediate segment 105b. In other words, the opening 120 is formed through the first passivation layer 113, the second passivation layer 115 and the portion of the dielectric layer 107, and another portion of the dielectric layer 107 is located between the opening 120 and the intermediate segment 105b.

Figure 1H:
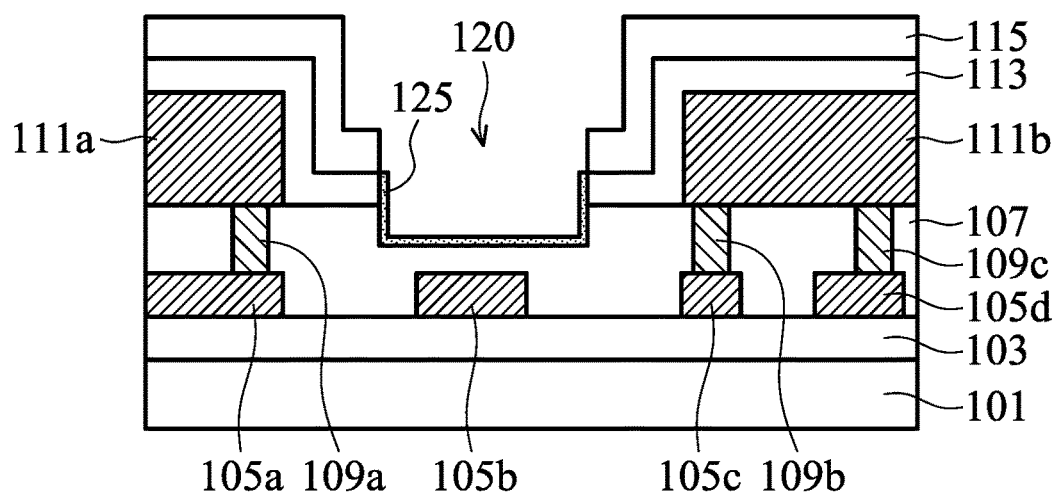

As shown in FIG. 1H, a protective film 125 is formed on a bottom and a portion of the sidewall of the opening 120, and the protective film 125 is covering a portion of the first passivation layer 113 exposed by the opening 120, in accordance with some embodiments. In other words, the protective film 125 is covering the portions of the dielectric layer 107 and the first passivation layer 113 which are exposed by the opening 120, but not covering the second passivation layer 115. In the present embodiment, the protective film 125 is formed by a heat treatment process with nitrogen. In the heat treatment process with nitrogen, nitrogen gas is introduced at high temperature to make the nitrogen gas interact with the dielectric layer 107 and the first passivation layer 113 which include silicon oxide and are exposed by the opening 120, such that a thin protective film 125 including silicon oxynitride is formed on the bottom and the portion of the sidewall of the opening 120. In some embodiments, the temperature of the heat treatment process with nitrogen is in a range from about 300° C. to about 700° C. In this embodiment, nitrogen gas will not interact with the second passivation layer 115 which includes silicon nitride.

Figure 1I:
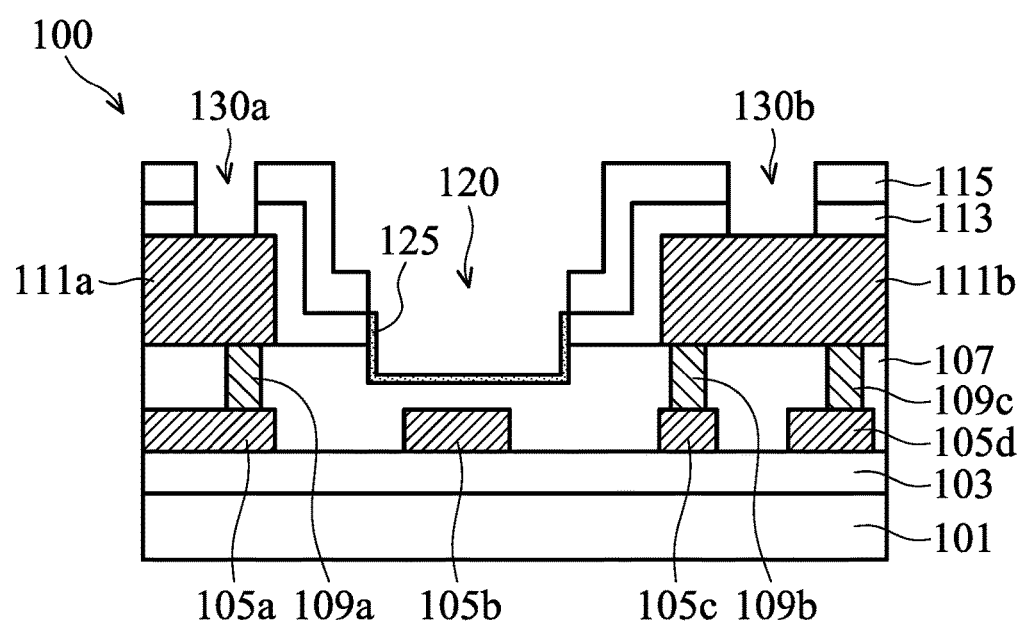

Then, as shown in FIG. 1I, a first hole 130a and a second hole 130b are formed, and each of these holes is formed through both the first passivation layer 113 and the second passivation layer 115. The first hole 130a and the second hole 130b are respectively located on the first conductive pad 111a and the second conductive pad 111b. The first hole 130a and the second hole 130b may be formed by an etching process. After forming the first hole 130a and the second hole 130b, the formation of the fuse element 100 is completed. Moreover, the first conductive pad 111a and the second conductive pad 111b may be electrically connected to external circuits through the first hole 130a and the second hole 130b.

Figure 2A:
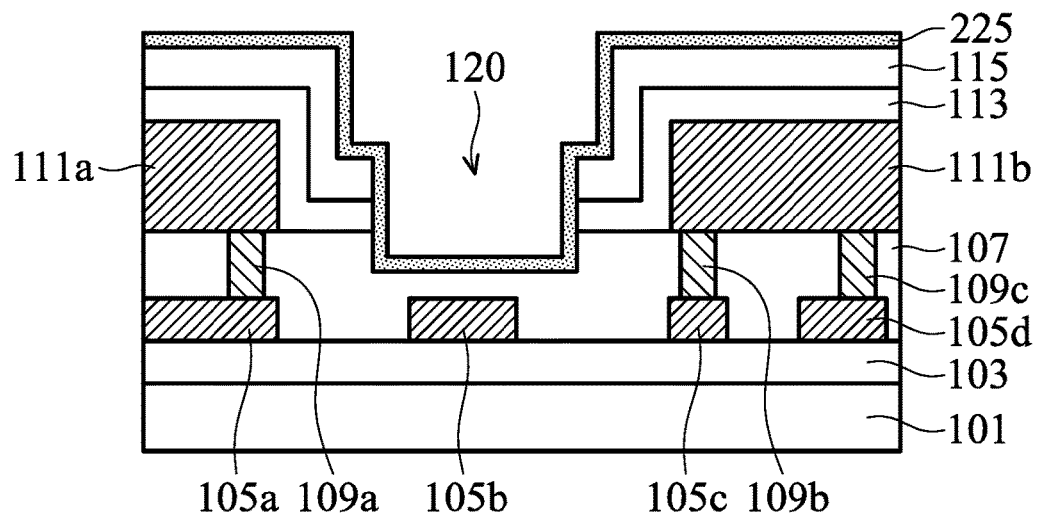
FIGS. 2A to 2B are cross-sectional views illustrating an exemplary sequential formation process of a fuse element in accordance with some other embodiments.
Figure 2B:
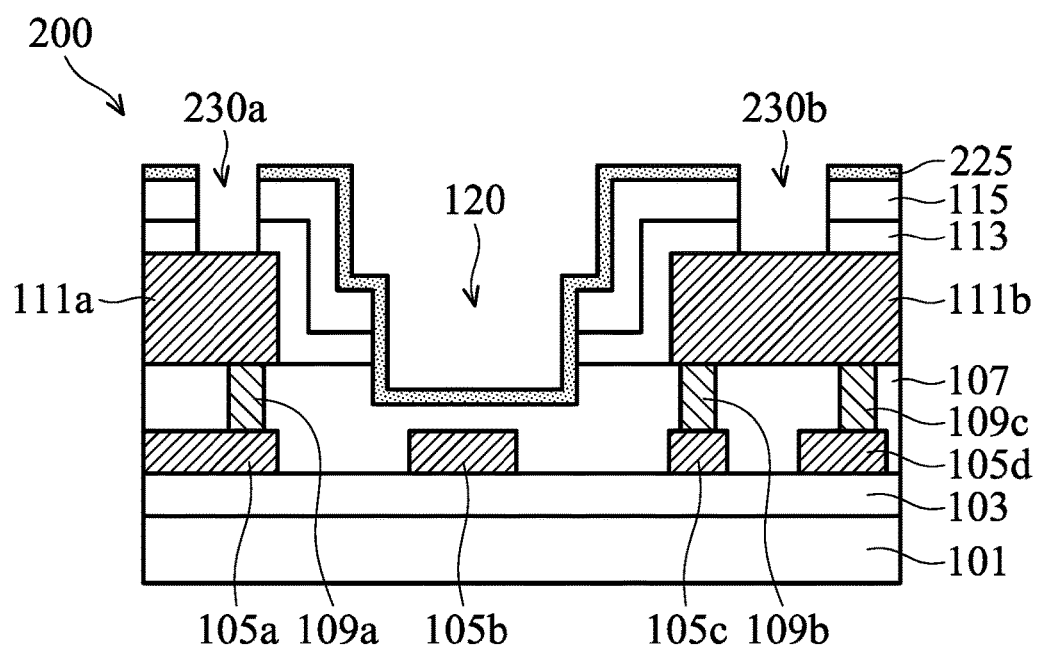

FIGS. 2A to 2B are cross-sectional views illustrating an exemplary sequential formation process of a fuse element 200 in accordance with some other embodiments. It should be noted that FIG. 2A is a step that follows the process shown in FIG. 1G.

Following the structure shown in FIG. 1G, as shown in FIG. 2A, after forming the opening 120, a protective film 225 is conformally formed on the second passivation layer 115, and on the sidewall and the bottom of the opening 120. In the present embodiment, the protective film 225 includes silicon nitride, and it is formed by a chemical vapor deposition (CVD) process. In other embodiments, the protective film 225 may include other hydrophobic materials, such as $Si_3N_4$, SiON or a combination thereof.

Then, as shown in FIG. 2B, a first hole 230a and a second hole 230b are formed, and each of these holes is formed through the first passivation layer 113, the second passivation layer 115, and the protective film 225. The first hole 230a and the second hole 230b are respectively located on the first conductive pad 111a and the second conductive pad 111b. The first hole 230a and the second hole 230b may be formed by an etching process. After forming the first hole 230a and the second hole 230b, the formation of the fuse element 200 is completed. Moreover, the first conductive pad 111a and the second conductive pad 111b may be electrically connected to external circuits through the first hole 230a and the second hole 230b.

The differences between the fuse element 100 shown in FIG. 1I and the fuse element 200 shown in FIG. 2B are that the materials, locations and the thicknesses of the protective films 125 and 225 are different. In comparison with the protective film 125 of the fuse element 100, the protective film 225 of the fuse element 200 further covers the portion of the second passivation layer 115 which is exposed by the sidewall of the opening 120, and extends onto the second passivation layer 115 outside of the opening 120. In addition, the thickness of the protective film 225 is greater than that of the protective film 125. In conclusion, since the protective film 225 of the fuse element 200 has a wider coverage and a greater thickness. The protective film 225 has a better ability to resist moisture than the protective film 125 of the fuse element 100. However, while a laser is used to blow the intermediate segment 105b in the subsequent application process, and since protective film 125 is thinner than protective film 225, and provided that the peripheral elements will not be damaged, a laser beam with less energy can be used, and the position of the laser aimed at the intermediate segment 105b can be precisely controlled.

In the fuse elements of the present disclosure, an opening above the intermediate segment of the metal layer is disposed and penetrates through the first passivation layer, the second passivation layer and a portion of the dielectric layer without exposing the intermediate segment. Since there is only a portion of the dielectric layer above the intermediate segment that is thinner than the other portion of the dielectric layer, a laser beam with less energy can be used to blow the intermediate segment, and the energy of the laser aimed at the intermediate segment can be precisely controlled, and the peripheral elements will not be damaged. On the other hand, the fuse elements of the present disclosure have a protective film formed in the opening which is located above the intermediate segment of the metal layer to prevent the portion of the dielectric layer above the intermediate segment, which is exposed by the opening, from interacting with external moisture. Moreover, the thickness of the protective film is thinner than that of the first and second passivation layers. Hence, the moisture resistance of the fuse elements can be increased, and the lifetime of the fuse elements can also be increased.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fuse element, comprising:
   a metal layer disposed on a substrate, wherein the metal layer comprises an intermediate segment, a first block and a second block, and the first block and the second block are electrically connected to two respective ends of the intermediate segment;
   a dielectric layer covering the intermediate segment, the first block and the second block;
   a first passivation layer disposed on the dielectric layer;
   a second passivation layer disposed on the first passivation layer;
   an opening penetrating through the first passivation layer, the second passivation layer and a portion of the dielectric layer, and located above the intermediate segment; and
   a protective film disposed on a bottom and a portion of a sidewall of the opening, and covering a portion of the first passivation layer exposed by the opening.

2. The fuse element as claimed in claim 1, wherein the intermediate segment is not exposed by the opening.

3. The fuse element as claimed in claim 1, wherein the first passivation layer is made of silicon oxide, and the second passivation layer is made of silicon nitride.

4. The fuse element as claimed in claim 1, further comprising:
   a first conductive pad and a second conductive pad disposed on the dielectric layer and respectively located above the first block and the second block, wherein the first passivation layer further covers top surfaces and sidewalls of the first conductive pad and the second conductive pad.

5. The fuse element as claimed in claim 4, further comprising:
   a first conductive via disposed in the dielectric layer, electrically connected to the first conductive pad and the first block; and
   a second conductive via disposed in the dielectric layer, electrically connected to the second conductive pad and the second block.

6. The fuse element as claimed in claim 4, further comprising:
   a first hole and a second hole respectively located on the first conductive pad and the second conductive pad, wherein each of the first hole and the second hole penetrates through both the first passivation layer and the second passivation layer.

7. The fuse element as claimed in claim 4, further comprising:
   a first hole and a second hole respectively located on the first conductive pad and the second conductive pad, wherein each of the first hole and the second hole penetrates through all of the first passivation layer, the second passivation layer and the protective film.

8. The fuse element as claimed in claim 1, wherein the protective film covers the dielectric layer exposed by the opening, and does not cover the second passivation layer.

9. The fuse element as claimed in claim 8, wherein the protective film is made of silicon oxynitride.

10. The fuse element as claimed in claim 1, wherein the protective film further covers the second passivation layer.

11. The fuse element as claimed in claim 10, wherein the protective film is made of silicon nitride.

12. A method for forming a fuse element, comprising:
    forming a metal layer on a substrate, wherein the metal layer comprises an intermediate segment, a first block and a second block, and the first block and the second block are electrically connected to two respective ends of the intermediate segment;

forming a dielectric layer covering the intermediate segment, the first block and the second block;

forming a first passivation layer on the dielectric layer;

forming a second passivation layer on the first passivation layer;

forming an opening above the intermediate segment, wherein the opening penetrates through the first passivation layer, the second passivation layer and a portion of the dielectric layer; and forming a protective film on a bottom and a portion of a sidewall of the opening, and covering the first passivation layer exposed by the opening.

13. The method as claimed in claim 12, further comprising:

forming a first conductive pad and a second conductive pad on the dielectric layer, wherein the first conductive pad and the second conductive pad are respectively located above the first block and the second block, and the first passivation layer further covers top surfaces and sidewalls of the first conductive pad and the second conductive pad.

14. The method as claimed in claim 13, wherein forming the opening comprises:

forming a patterned photoresist layer on the second passivation layer; and using the patterned photoresist layer as a mask, removing a portion of the first passivation layer, a portion of the second passivation layer and a portion of the dielectric layer, which are above the intermediate segment by etching to form the opening without exposing the intermediate segment.

15. The method as claimed in claim 14, wherein the patterned photoresist layer further covers a portion of the second passivation layer on the sidewalls of the first conductive pad and the second conductive pad.

16. The method as claimed in claim 13, further comprising:

forming a first hole and a second hole penetrating through both the first passivation layer and the second passivation layer, wherein the first hole and the second hole are respectively located on the first conductive pad and the second conductive pad.

17. The method as claimed in claim 13, further comprising:

forming a first hole and a second hole penetrating through all of the first passivation layer, the second passivation layer and the protective film, wherein the first hole and the second hole are respectively located on the first conductive pad and the second conductive pad.

18. The method as claimed in claim 13, further comprising:

forming a first conductive via in the dielectric layer, electrically connected to the first conductive pad and the first block; and forming a second conductive via in the dielectric layer, electrically connected to the second conductive pad and the second block.

19. The method as claimed in claim 12, wherein forming the protective film comprises a heat treatment process with nitrogen, and the protective film does not cover the second passivation layer.

20. The method as claimed in claim 12, wherein forming the protective film comprises a chemical vapor deposition process, and the protective film further covers the second passivation layer.

* * * * *